US012665557B2

(12) United States Patent
Friedmann et al.

(10) Patent No.: US 12,665,557 B2
(45) Date of Patent: Jun. 23, 2026

(54) SINGLE-ENDED TO DIFFERENTIAL CONVERTER

(71) Applicants:Eliahu Friedmann, Bat Shlomo (IL); Stefan Marinca, Baia Mare CP (RO)

(72) Inventors: Eliahu Friedmann, Bat Shlomo (IL); Stefan Marinca, Baia Mare CP (RO)

( * ) Notice: Subject to any disclaimer, the term of this patent is extended or adjusted under 35 U.S.C. 154(b) by 630 days.

(21) Appl. No.: 18/103,554

(22) Filed: Jan. 31, 2023

(65) Prior Publication Data

US 2023/0246614 A1      Aug. 3, 2023

(30) Foreign Application Priority Data

Feb. 1, 2022      (GB) ...................................... 2201268

(51) Int. Cl.
*H03F 3/45*            (2006.01)

(52) U.S. Cl.
CPC ...   *H03F 3/45475* (2013.01); *H03F 2200/165* (2013.01)

(58) Field of Classification Search
CPC .. H03F 3/45475; H03F 2200/165; H03F 1/26; H03H 11/32
USPC .......................... 330/252, 259, 260, 261, 301
See application file for complete search history.

(56) References Cited

U.S. PATENT DOCUMENTS

| | | | | |
|---|---|---|---|---|
| 6,259,325 | B1 * | 7/2001 | Ishizuka .............. | H03D 7/1433 330/307 |
| 10,686,418 | B1 * | 6/2020 | Murata ................... | H03G 3/30 |
| 2016/0072442 | A1 * | 3/2016 | Testi ................... | H03F 3/45183 330/278 |
| 2017/0063347 | A1 | 3/2017 | Raghupathy | |

FOREIGN PATENT DOCUMENTS

WO            2021232030            11/2021

OTHER PUBLICATIONS

Wikipedia "Band-pass Filter" (Year: 2025).*

* cited by examiner

*Primary Examiner* — Andrea Lindgren Baltzell
*Assistant Examiner* — Nareh Shamiryan
(74) *Attorney, Agent, or Firm* — Stephen T. Scherrer; Monique A. Morneault; Scherrer Patent & Trademark Law, P.C.

(57)            ABSTRACT

The present application provides a single-ended to differential converter for converting a single-ended input to dual outputs. The converter comprises a band pass filter having an input node for coupling to the single-ended input, an output node, and a reference node, wherein the band pass filter is arranged to band pass filter the single ended input and provide the band pass filtered input signal to the output node as an output signal, an amplifier circuit accepting the output signal as an input and providing dual outputs, and a DC biasing circuit for generating a bias voltage and applying it to the reference node of the band pass filter. By presenting the bias voltage to the reference node of the band pass filter, a number of advantages including lower noise are achieved.
16 Claims, 6 Drawing Sheets

300

SINGLE-ENDED TO DIFFERENTIAL CONVERTER

FIELD OF THE APPLICATION

The present application presents a method and circuit to convert a single-ended signal to differential signals to be used in communications and instrumentations.

BACKGROUND

There are many applications in telecommunication systems or instrumentation where single-ended signals, usually AC signals, must be converted to differential balanced signals. For example, a signal from the antenna is single-ended but it has to be converted to differential balanced signals.

One known solution is to employ a broad-band pulse transformer with single primary winding and a centre-tapped secondary winding, as shown in FIG. 1, to convert a single ended signal of a single ended signal source 108 to two balanced signals. The input signal is applied to a first terminal 110 of a broad-band pulse transformer, 102, with the second terminal 112 connected to ground 120. The midpoint terminal on the secondary side, 114, is suitably connected to a DC biasing voltage (not shown). The two outputs, from the other terminals 115 and 116, of the secondary side of the transformer are balanced and opposite in phase. The transformer can have the advantage of gaining the input signal without adding noise. However, it has the disadvantage of being large in volume and having limited linearity and frequency range.

The pulse transformer solution is also not suitable for IC implementation. If the conversion circuit is supplied from a unipolar supply voltage the input signal has to be DC shifted somewhere between the two power supply levels, positive (Vdd) and negative (gnd). Very often separation capacitors and resistor dividers are used to shift the input AC signal. The values of the resistance have to be large in order not to affect the sensitivity and noise of the input circuit. The use of large resistors requires large silicon area, when implemented in an IC and corresponding large noise at the input of the first gain stage.

A second known circuit 200 which translates an AC single-ended signal to differential signals is presented as the circuit in FIG. 2. Here the input AC single-ended source, 208, is applied between the non-inverting nodes of the two operational amplifiers (OA), 221 and 222. Two balanced resistors, 223 and 224, are connected in parallel to the input source signal 208. At the common node of the resistors 223 and 224 a DC biasing voltage 226 is applied. The role of the DC biasing voltage 226 is to set the DC voltage at two non-inverting nodes of the amplifiers 221 and 222. The negative feedback and the closed-loop gain of the amplifiers 221, 222 are set via three resistors, 227, 228 and 229. As can be seen the input signal is divided across the resistors 223 and 224. At the same time assuming that the amplifiers are ideal the voltage of the input source is reflected across the resistor 228. Setting the two resistors 227 and 229 to have the same value, ensures the output signals 214 and 216 are balanced, of the same value and opposite in phase. The resistors 223 and 224 are series connected with the input signal source 208, such that the input AC voltage is divided between the sum of the resistor and the internal impedance of the AC single-ended signal source 208 (not represented in this diagram). In order to reduce the attenuation factor, the resistors 223 and 224 are desirably large but as identified above large resistors generate associated noise.

A further known circuit 300 employing a common front-end analog block is presented in FIG. 3. An AC input signal from a source signal, 308, with one terminal connected to the common ground, 320, is connected with the second terminal 310 to the input of a passband filter 331. The output signal from the passband filter 331, which is also referenced to the common ground 320, is applied via a separation capacitor 332, to the non-inverting input of an operational amplifier 333. A DC shift voltage is required if the amplifier is supplied from a single supply voltage. This shift is made via a voltage divider based on two resistors, 334 and 335, between a DC voltage 326 and the common ground 320. The feedback and the gain of the amplifier are set via two resistors, 337 and 338. The output 339 from the amplifier 333 is then inverted via a second amplifier (not shown), in order to generate an inverted balanced signal. As with the circuit of FIG. 2 the values of the resistors have to be large in order not to attenuate the signal from the output node of the filter. As previously described, large resistors will affect the noise of the circuit and also will require large silicon area, which will increase the cost.

Therefore, a need exists for a circuit to convert a single ended signal to corresponding differential balanced signals such that the DC biasing circuit will not affect the impedance at the input of the amplifier.

SUMMARY

The present application presents a method and circuit to convert a single-ended AC signal into two balanced and opposite in-phase signals. Such a circuit may be used, for example, in instrumentation, signal processing or telecommunication systems, any time an analog translation from a single-ended input to dual outputs is required.

In a first aspect, a single-ended to differential converter is provided for converting a single-ended input to dual outputs. The converter comprises a band pass filter, an amplifier circuit and a DC biasing circuit. The band pass filter has an input node for coupling to the single-ended input, an output node, and a reference node and is arranged to band pass filter the single ended input and provide the band pass filtered input signal to the output node as an output signal. The amplifier circuit accepts the output signal as an input and provides the dual outputs. The DC biasing circuit generates a bias voltage and applies it to the reference node of the band pass filter.

The amplifier circuit suitably comprises a first operational amplifier having a first inverting input and a first non-inverting input and providing a first output to a first output node, wherein the output node of the band pass filter is connected to the first non-inverting input and a first feedback path is provided between the first output node and the first inverting input, a second operational amplifier having a second inverting input and a second non-inverting input and providing a second output to a second output node wherein the reference node of the band pass filter is connected to the second non-inverting input and a second feedback path is provided between the second output node and the second inverting input, and a gain element connected between the first inverting input and the second inverting input. The first feedback resistor may be in the first feedback path and a second feedback resistor may be provided in the second feedback path and the gain element may comprise a gain resistor. In this configuration, the sum of the resistances of the first feedback resistor and the gain resistor may approximately equate to the resistance of the second feedback resistor.

The band pass filter may be a RC bandpass filter or LC bandpass filter.

In an exemplary RC bandpass filter, a first filter capacitor is connected between the input of the band pass filter and an intermediate filter node, a first filter resistor connected between the intermediate filter node and the reference node, a second filter resistor connected between the intermediate filter node and the output node and a second filter capacitor connected between the output node and the reference node and a third filter capacitor connected between the reference node and ground.

In an exemplary LC bandpass filter, a first filter capacitor is connected between the input of the band pass filter and the output node a first filter inductor is connected between the output node and the reference node, a second filter capacitor is connected between the output node and the reference node and a third filter capacitor connected between the reference node and ground.

The bandpass filter may include a notch filter. In such an arrangement, the band pass filter may comprise a first capacitor connected at a first end to the input node and at the second end to a second capacitor connected in series with a third capacitor to the output node, with a first resistor connected between the second end of the first capacitor and the reference node, a fourth capacitor connected between the reference node and ground, a second resistor connected between the common node of the second capacitor and third capacitor and ground, a fourth resistor and fifth resistor connected in series between the second end of the first capacitor and the output node with a fifth capacitor connecting the common node between the fourth and fifth resistors and ground.

The biasing circuit may comprise a first bias circuit resistor connected at a first end to a voltage source and at a second end to the reference node, a second bias circuit resistor connected between the reference node and ground. Alternatively, the biasing circuit may comprise a first transistor having a first source, first gate and first drain and a second transistor having a first source, first gate and first drain wherein the first source is connected to a reference voltage with the first gate, second gate and the first and second drains commonly connected to the reference node and the second source connected to ground.

In a second aspect, a single-ended to differential converter is provided for converting a single-ended input to dual outputs. This converter comprises a band pass filter having an input node for coupling to the single-ended input, an output node, and a reference node, wherein the band pass filter is arranged to band pass filter the single ended input and provide the band pass filtered input signal to the output node as an output signal. The converter further comprises a first operational amplifier having a first inverting input and a first non-inverting input and providing a first output to a first output node, wherein the output node of the band pass filter is connected to the first non-inverting input and a first feedback path is provided between the first output node and the first inverting input and a second operational amplifier having a second inverting input and a second non-inverting input and providing a second output to a second output node wherein the reference node of the band pass filter is connected to the second non-inverting input and a second feedback path is provided between the second output node and the second inverting input with a gain resistor connected between the first inverting input and the second inverting input. The reference node of the band pass filter is biased by a DC voltage.

A first feedback resistor may be provided in the first feedback path and a second feedback resistor is provided in the second feedback path and wherein the sum of the resistances of the first feedback resistor and the gain resistor are approximately equal to the resistance of the second feedback resistor. The band pass filter may comprise a first filter capacitor connected between the input of the band pass filter and an intermediate filter node, a first filter resistor connected between the intermediate filter node and the reference node, a second filter resistor connected between the intermediate filter node and the output node and a second filter capacitor connected between the output node and the reference node.

The band pass filter may comprise a first filter capacitor connected between the input of the band pass filter and the output node a first filter inductor is connected between the output node and the reference node, a second filter capacitor is connected between the output node and the reference node and a third filter capacitor connected between the reference node and ground.

The band pass filter may comprise a first capacitor connected at a first end to the input node and at the second end to a second capacitor connected in series with a third capacitor to the output node, with a first resistor connected between the second end of the first capacitor and the reference node, a fourth capacitor connected between the reference node and ground, a second resistor connected between the common node of the second capacitor and third capacitor and ground, a fourth resistor and fifth resistor connected in series between the second end of the first capacitor and the output node with a fifth capacitor connecting the common node between the fourth and fifth resistors and ground.

The biasing circuit may comprise a resistive voltage divider or a transistor voltage divider. A resistive voltage divider may comprise a first bias circuit resistor connected at a first end to a voltage source and at a second end to the reference node, a second bias circuit resistor connected between the reference node and ground and a first bias circuit capacitor connected between the reference node and ground.

A transistor voltage divider may comprise a first transistor having a first source, first gate and first drain and a second transistor having a first source, first gate and first drain wherein the first source is connected to a reference voltage with the first gate, second gate and the first and second drains commonly connected to the reference node and the second source connected to ground.

In a third aspect, a single-ended to differential converter for converting a single-ended input to dual outputs is provided. The converter comprising a filter, a first operational amplifier, a second operational amplifier and a gain element.

The filter has an input node for coupling to the single-ended input, an output node, and a reference node connected to a DC bias voltage, wherein the filter is arranged to filter the single ended input and provide the filtered input signal to the output node as an output signal.

The first operational amplifier has a first inverting input and a first non-inverting input and providing a first output to a first output node, wherein the output node of the band pass filter is connected to the first non-inverting input and a first feedback path is provided between the first output node and the first inverting input.

The second operational amplifier has a second inverting input and a second non-inverting input and providing a second output to a second output node wherein the reference node of the band pass filter is connected to the second non-inverting input and a second feedback path is provided between the second output node and the second inverting input, wherein a first feedback resistor is provided in the first feedback path and a second feedback resistor is provided in the second feedback path and the gain element comprises a gain resistor and wherein the sum of the resistances of the first feedback resistor and the gain resistor are approximately equal to the resistance of the second feedback resistor. The gain element is connected between the first inverting input and the second inverting input.

DETAIL DESCRIPTION

Figure 4:
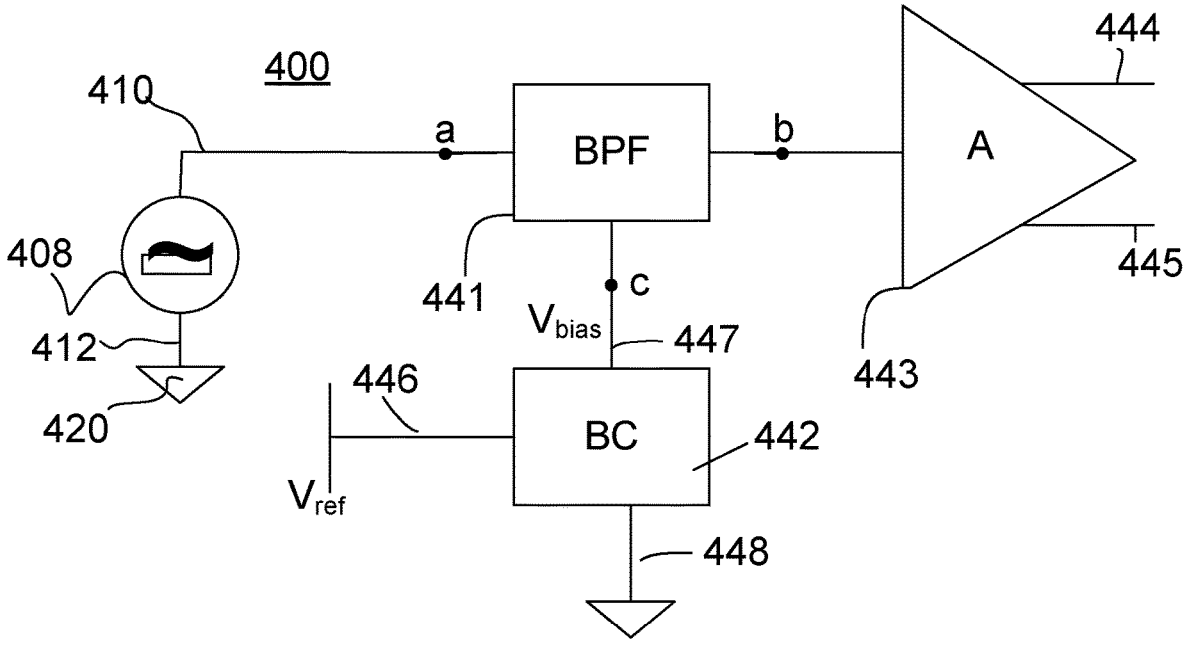
FIG. 4 illustrates a block diagram of a single-ended to differential converter in accordance to a first aspect of the present application.

FIG. 4 illustrates an exemplary block diagram of a single-ended to differential converter 400 for converting a single-ended input 410 from a single-ended signal source 408 to dual outputs 444, 445. The converter 400 comprises a filter (BPF), an amplifier 443, and a DC biasing circuit (BC) 442.

The filter is suitably a band pass filter 441. The band pass filter 441 comprises an input node a, an output node b, and a reference node c. The band pass filter is arranged to band pass filter an input signal 410 provided to the input node a and provide a band pass filtered output signal at the output node b. The filter response of the band pass filter is selected to allow signals with frequencies of interest to pass through. Suitably, there is a DC path provided between the output node b and the reference node c.

As shown, the single ended signal source 408, which is referenced by a connection 412 to ground 420, provides an input signal 410 to the input node a of the band pass filter 441.

The DC biasing circuit 442 in turn has a voltage input node 446, a ground connection 448, and an output node 447. The voltage input node 446 is suitably connected to a reference voltage $V_{ref}$ which may for example be a supply voltage of the circuit. The DC biasing circuit is configured such that a DC biasing voltage $V_{bias}$ is outputted at the output node 447.

The reference node c of the band pass filter 441 is connected to the output node 447 of the DC biasing circuit 442. As a result, the bias voltage $V_{bias}$ is caused to be applied via the DC path of the filter 441 to the input of the amplifier 443. At the same time, the biasing circuit 442 suppresses to ground the AC signals of the interested frequency band pass from the nodes "a" to "b".

Figure 1:
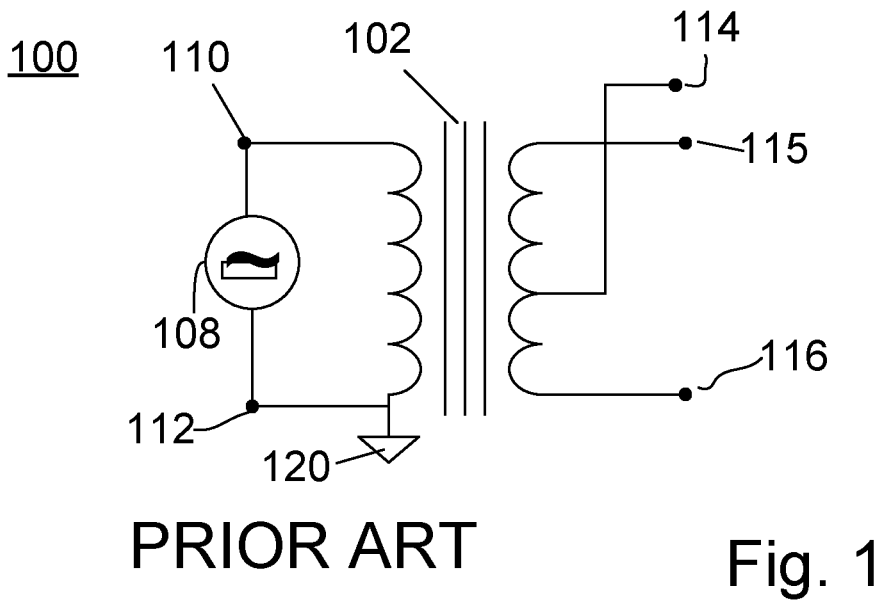
FIG. 1 illustrates a first prior art circuit for converting a single ended signal to a differential signal using a transformer
Figure 2:
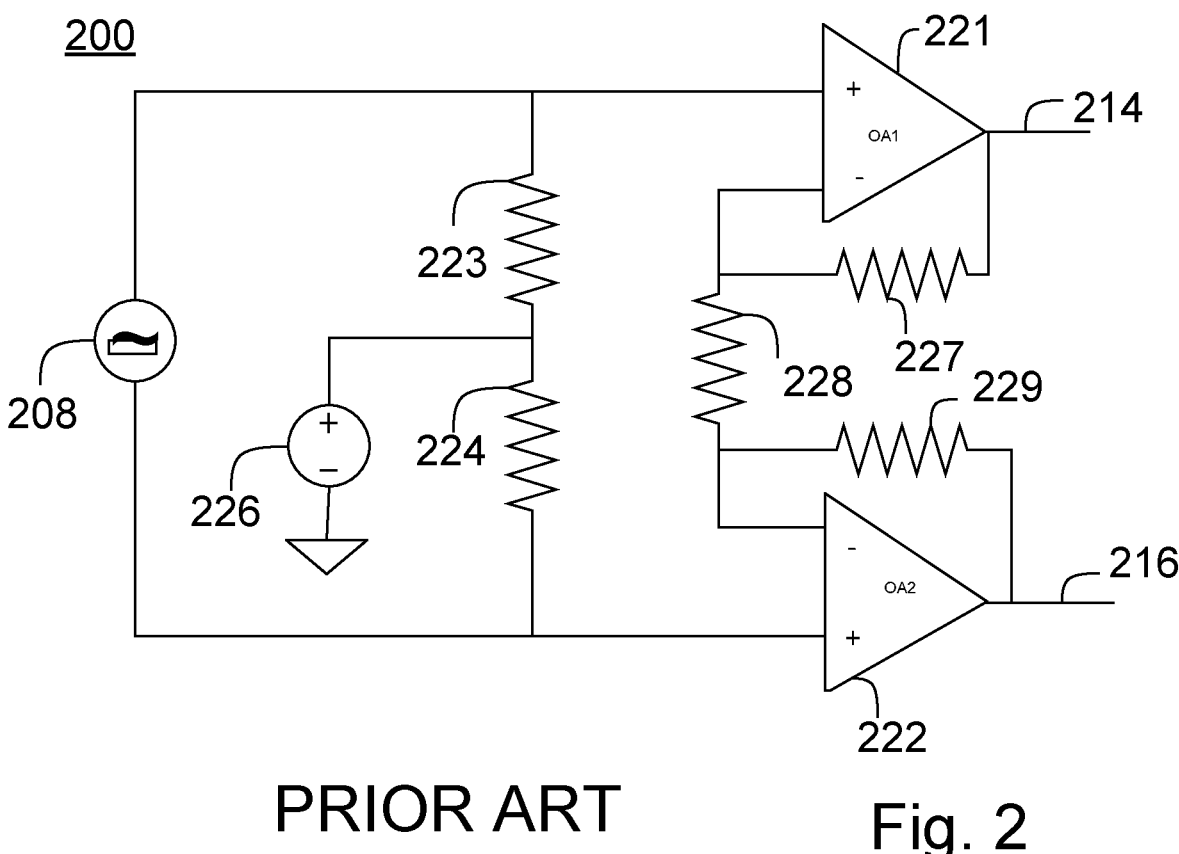
FIG. 2 illustrates a second prior art circuit which converts a single ended signal to a differential signal without a transformer.
Figure 3:
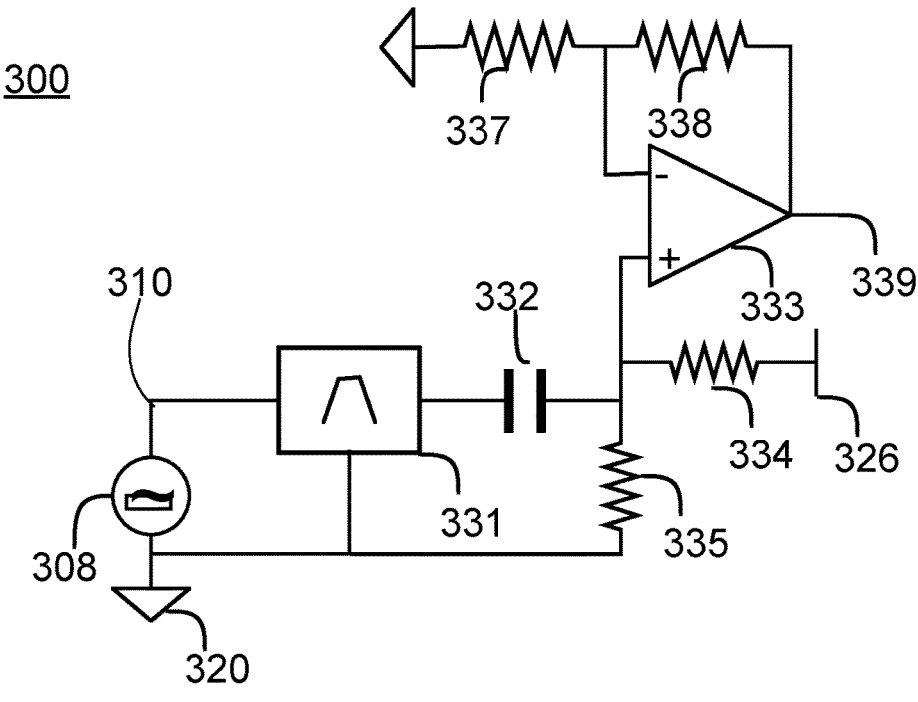
FIG. 3 illustrates a third prior art circuit which converts a single ended signal to a differential signal of an AC input signal using an band-pass filter and a voltage divider in front of an operational amplifier.

The final result is that the amplifier 443 has a DC bias voltage and there is no load in parallel to the bandpass filter to attenuate the input signal or to introduce voltage noise as in the prior art example of FIG. 3.

Figure 5:
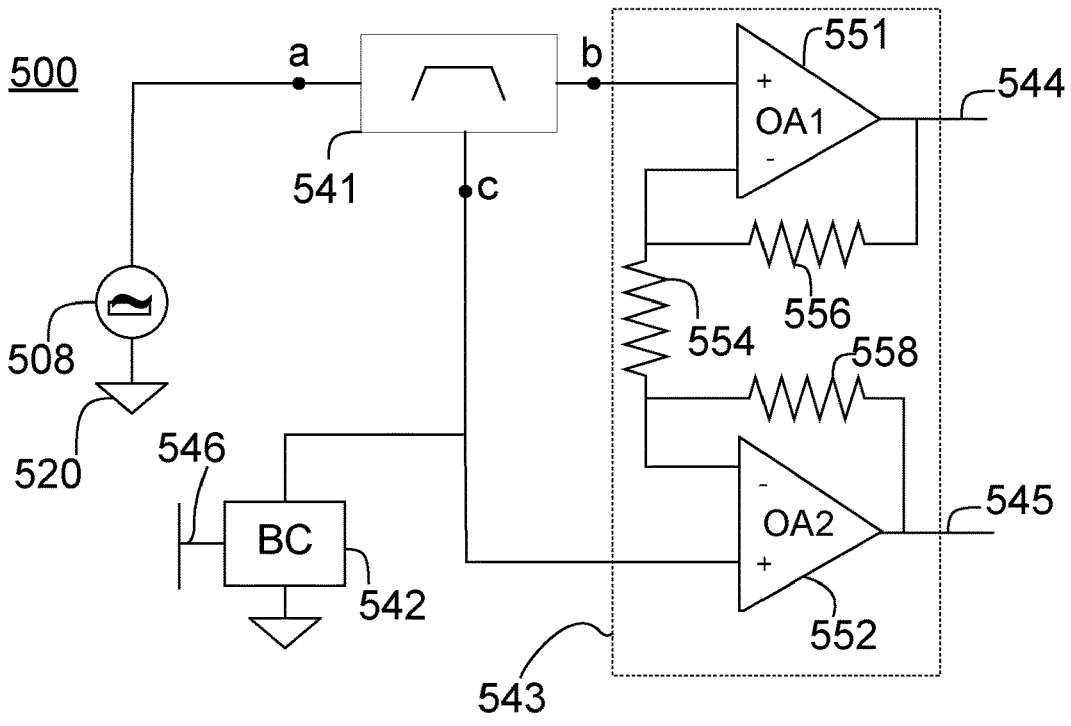
FIG. 5 illustrates a practical implementation of the arrangement of FIG. 4.

An exemplary implementation 500 of the converter of FIG. 4 is illustrated in FIG. 5, with an exemplary amplifier 543. In the implementation, a single-ended signal source, 508, is connected with one end to the common ground node, 520, and with the second end to the input node a of a bandpass filter, 541. The output node b of the bandpass filter is connected to the noninverting input of a first operational amplifier 551 forming part of amplifier circuit 543. The reference node c of the bandpass filter is connected to the output node of a biasing circuit, 542. The common node of the filter and the biasing circuit is also connected to the noninverting input of a second operational amplifier 552 of amplifier circuit 543.

Two resistors 556, 558 set the feedback paths of the two amplifiers, 551 and 552. A third resistor 554 sets the gain of the two amplifiers 551, 552. Assuming that the two operational amplifiers 551, 552 have a high input impedance their two noninverting inputs are biased with substantially the same DC voltage level.

In normal operation, the inverting node of the amplifier 551 will follow the AC voltage at the node "b" and the inverting node of the amplifier 552 will follow the voltage at the node "c" which is AC ground. As a result, the output voltage of the bandpass filter, from nodes b and c, is reflected across resistor 554. A corresponding AC current is generated on the resistor 554. This current flow via the feedback resistors, 556 and 558, from the output node, 544, of the first amplifier 551 to the output node 545 of the second amplifier 552.

Taking it that the resistors 554, 556 and 558 have corresponding resistance values of $R_{554}$, $R_{556}$ and $R_{558}$ the AC voltages at the outputs 544, 545 of the first and second operation amplifiers 551, 552 may be stated as:

$$V_{544} = V_{in}(1 + \frac{R_{556}}{R_{554}}) \text{ and } V_{545} = -V_{in}\frac{R_{558}}{R_{554}} \tag{1}$$

The condition to generate output balanced voltages at the outputs is:

$$R_{558} = R_{556} + R_{554} \tag{2}$$

One key benefit arising from this implementation is that the full input signal is applied to the noninverting node of the amplifier 551. In contrast, in the prior art methods and circuits, the input AC signals at the two noninverting inputs of the amplifiers are half of the input signal.

As a result, the noise at the amplifier's outputs are about $\sqrt{2}$ less compared to the prior art circuits and methods. At the same time, the input signal at the interested frequency band is not attenuated and there are no input resistors with associated noise.

Figure 6:
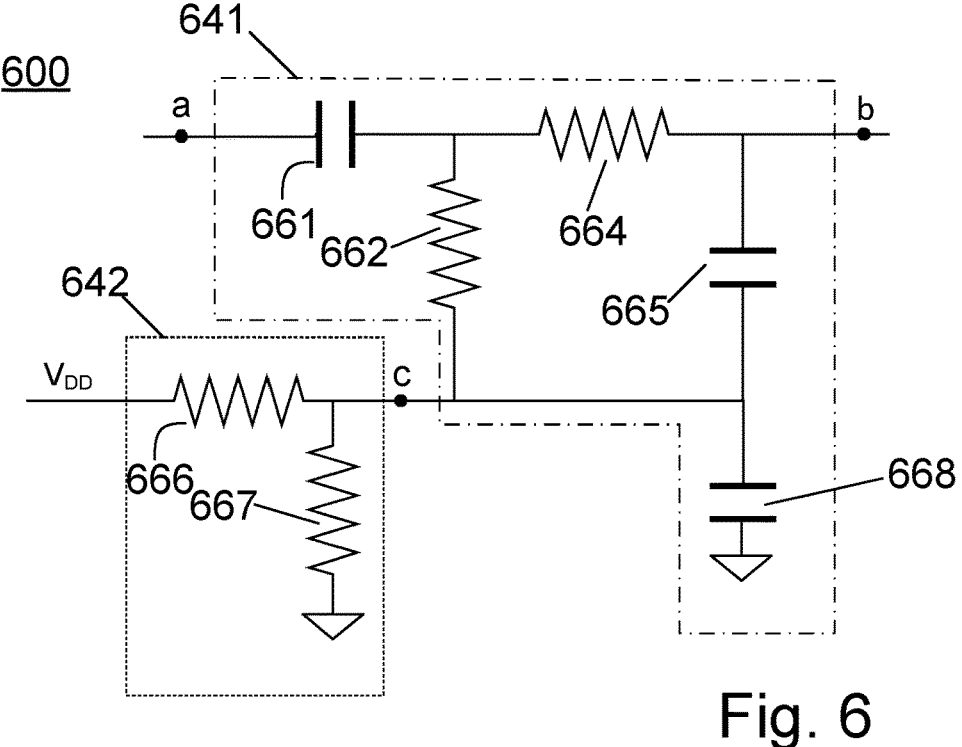
FIG. 6 illustrates a detailed schematic of an exemplary RC band-pass filter and a DC biasing circuit which may be employed in the arrangement of FIG. 5.

An exemplary implementation 600 of a DC biasing circuit 642 with a bandpass RC filter 641 is presented in FIG. 6.

The bandpass filter 641 comprises two resistors, 662, 664, and three capacitors, 661, 665, 668 which are selected to provide a desired band pass filter characteristic.

The DC biasing circuit consists of a voltage divider, based on two resistors, 666, 667 with the supply voltage $V_{DD}$ acting as the reference voltage for the biasing circuit and providing a bias voltage at the reference node c of the bandpass filter 641.

The DC bias voltage at node c is applied via the resistors 662, 664 to the output node b of the band pass filter.

Taking the amplifier arrangement of FIG. 5 as an example, this would result in the output node from the band pass filter arrangement being connected to the noninverting input of the first operational amplifier 551. The same DC voltage from the reference node c of the band pass filter is applied to the noninverting node of the second amplifier, 552.

Suitably, the value of the capacitor 668 is selected to be much larger than the value of the capacitor 665 such that the AC voltage at the node "c" is effectively suppressed to ground.

Accordingly, the two inputs presented to the amplifier 551 from the band pass filter of FIG. 6 will have substantially the same AC voltage, the AC voltage from the output of the filter 641, and the two inputs of the amplifier 552 will be AC grounded.

Figure 7:
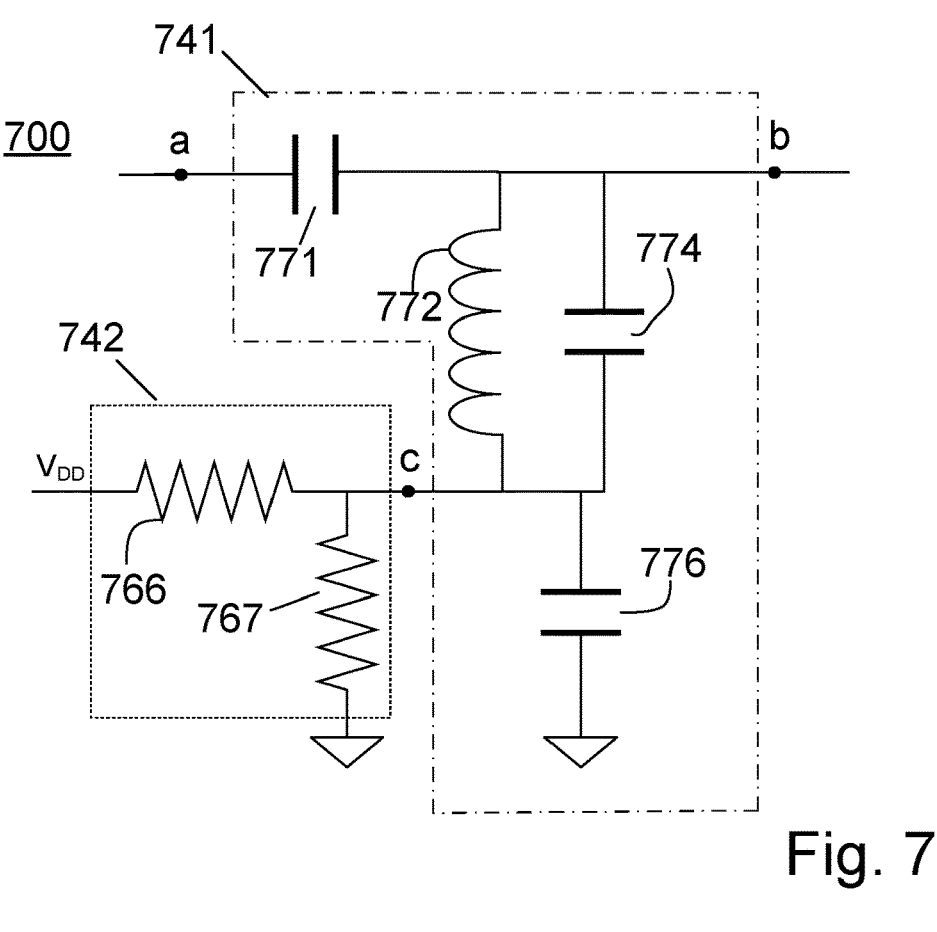
FIG. 7 illustrates a detailed schematic of an exemplary LC band-pass filter and a DC biasing circuit which may be employed in the arrangement of FIG. 5.

A further exemplary implementation 700 of a bandpass filter 741 and DC biasing circuit 742 is presented in FIG. 7. In this implementation, the bandpass filter is a second order LC bandpass filter. The second order LC bandpass filter comprises an inductor 772 and capacitors 771 and 774, with the reference node connected to ground by a further capacitor 776. The first capacitor 771 is connected between the input node a and the output node b. The second capacitor 774 is connected in parallel with the inductor 772 between the output node b and the reference node c.

As before, the voltage biasing circuit comprises a voltage divider employing two resistors, 766, 767.

When connected to an amplifier such as described above in FIG. 5, the inductor 772 has no DC resistance or very small resistance so that the DC voltage at the noninverting node of first operational amplifier 551 would be the same as the output voltage of the voltage divider, resulting in the same result as that of FIG. 6.

Figure 8:
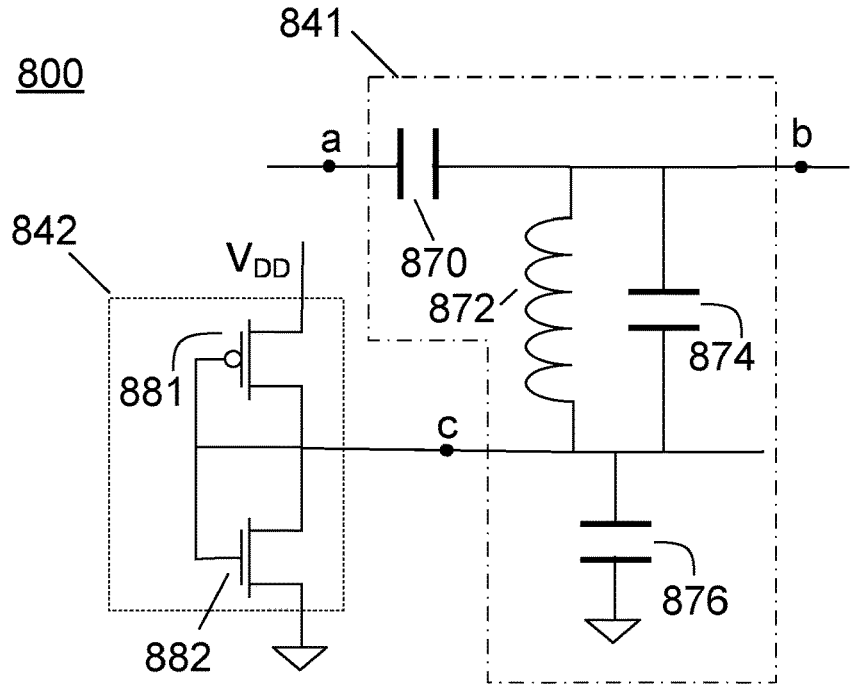
FIG. 8 illustrates a similar circuit to FIG. 7 with biasing circuit based on two MOS transistors.

A third implementation 800 of a biasing circuit in connection to a second order bandpass filter is presented in FIG. 8.

The band pass filter 841 comprises three capacitors 870, 874 and 876 and an inductor 872 and corresponds to the band pass filter of FIG. 7, with the only difference from the circuit of FIG. 7 being that that in the biasing circuit 842 the resistive voltage divider of FIG. 7 is replaced with two MOS transistors, 881, 882. The first MOS transistor 881 is suitably a PMOS transistor. The source of the first MOS transistor 881 is connected to the reference voltage $V_{DD}$ and the gate and drain are commonly connected to the output node of the biasing circuit. The second MOS transistor 882 is suitably a NMOS transistor. The source of the second MOS transistor is connected to ground with the gate and drain commonly connected to the output node of the biasing circuit. The result of this arrangement is that a biasing voltage is provided at the output node of the biasing circuit 842 (reference node c of band pass filter 841).

Figures 9, 10:
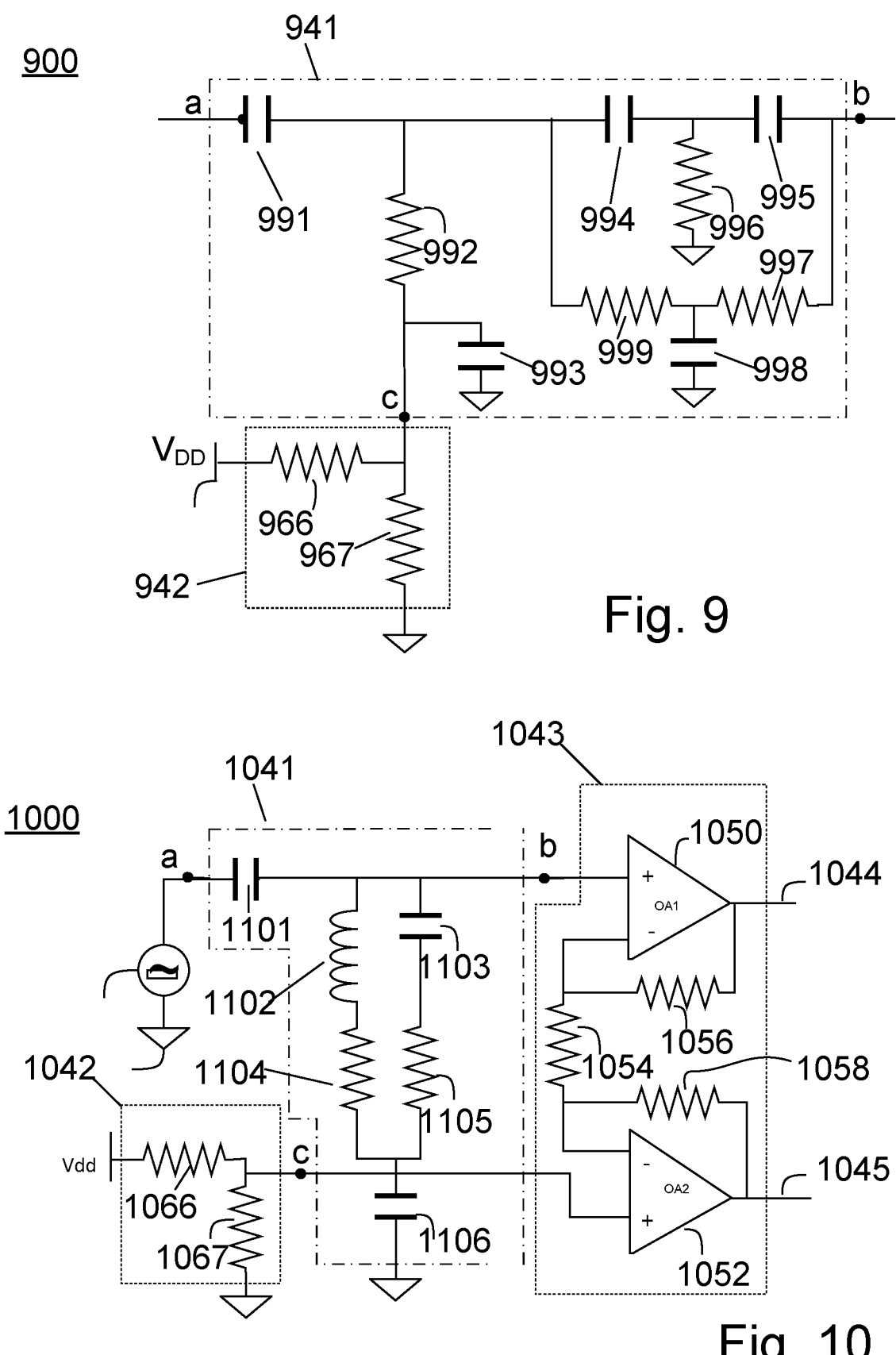
FIG. 9 illustrates an exemplary RC notch filter in conjunction with a corresponding DC biasing circuit that may be employed to implement the arrangement of FIG. 4.
FIG. 10 illustrates a practical LC filter and single-ended conversion circuit where the intrinsic resistors of the inductor (L) and capacitor (C) are considered, FIG. 11 illustrate simulation results of a circuit according to FIG. 10.
Figure 11:
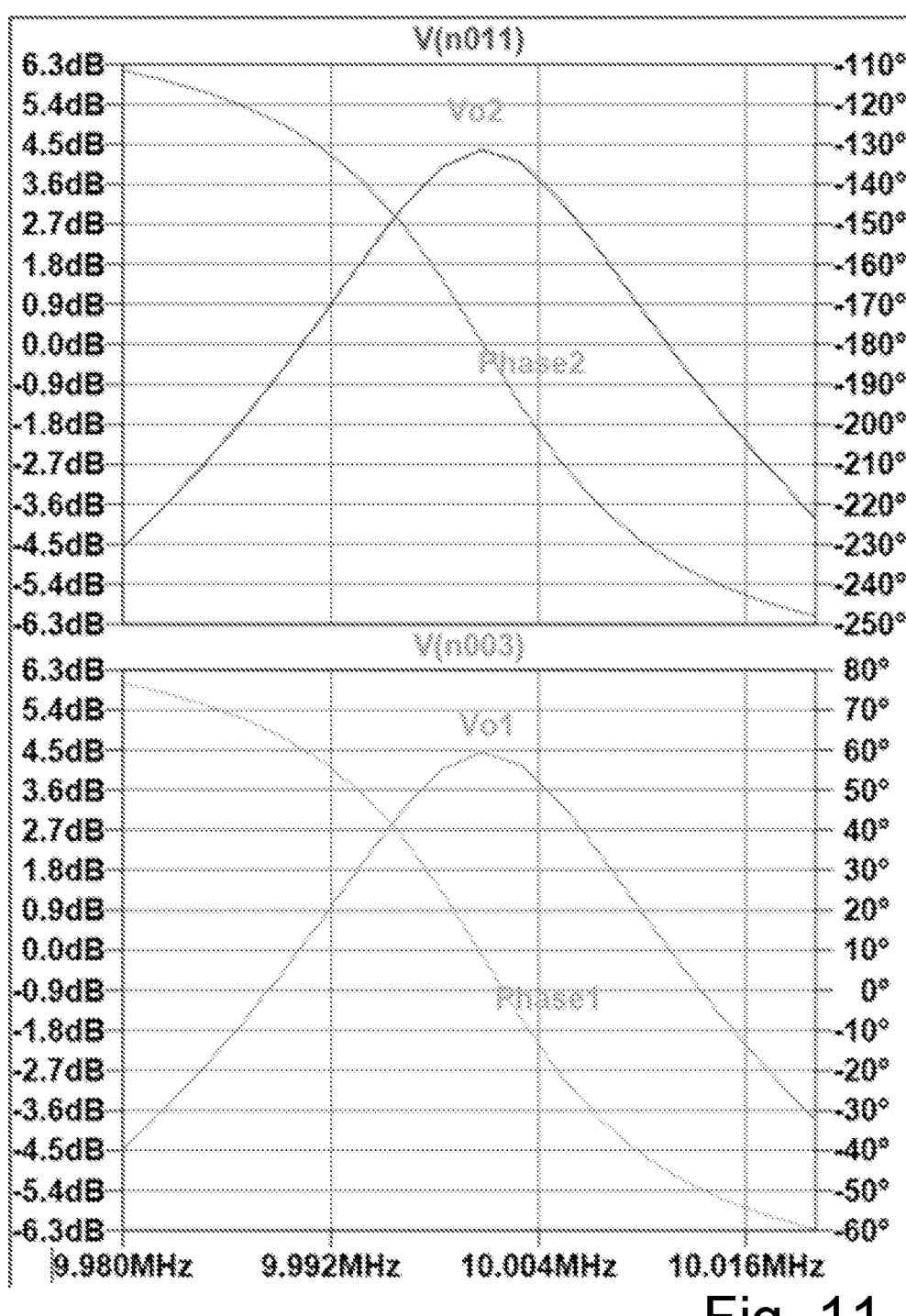

A further implementation 900 is presented in FIG. 9, of a DC biasing circuit 942 with a band pass filter 941. The band pass filter 941 includes a notch filter. The DC biasing circuit 942 comprises two resistors 966, 967 as described above in the implementations of FIGS. 6 and 7.

The band pass filter comprises a first capacitor 991 connected at a first end to the input node a, and at a second end to a first node in common with a first end of a second capacitor 994 and a first end of a first resistor 992.

The second end of the second capacitor in turn is connected to the first end of a third capacitor 995 with the second end of the third capacitor connected to the output node b. The second end of the first resistor 992 is connected to the reference node c. A fourth capacitor 993 is connected between the reference node c and ground. A second resistor 996 is connected between the common node of the second and third capacitors 994, 995 and ground. A first end of a third resistor 999 is connected to the first node, i.e. the node common to ends of the first and second capacitors 991, 994 and the first resistor 992. The second end of the third resistor 999 is connected to the first end of a fourth resistor 997. The second end of the fourth resistor 997 is connected to the output node b. A fifth capacitor 998 is connected at a first end to the common node between the third and fourth resistors 999, 997 and at a second end to ground.

The role of the fourth capacitor 9938 is to suppress to ground at the reference node AC input signals. The notch filter consists of the second, third and fifth capacitors, 994, 995 and 998, and the second, third and fourth resistors 996, 999 and 997. The DC voltage at the high impedance node, "b", is set by the path through the first resistor 992, third resistor 999 and fourth resistor 997.

To demonstrate the effectiveness of the present application, a practical circuit implementation was simulated using the LTSpice® program provided by Analog Devices Inc. The practical circuit implementation employs the bandpass filter 741 and biasing circuit 742 of FIG. 7 as the band pass filter 1041 and biasing circuit 1042 with the amplifier 543 from FIG. 5 employed as the amplifier 1043.

Thus, capacitor 1101 of the band pass filter 1041 corresponds to capacitor 771 of FIG. 7, with capacitor 1106 corresponding to capacitor 776. Inductor 1102 corresponds to inductor 772 with the inclusion of a parasitic series resistor 1104. Similarly, capacitor 1103 corresponds to capacitor 774 with the inclusion of a parasitic series resistor 1105. Resistors 1066 and 1067 of the biasing circuit 1042 correspond to resistors 766 and 767. In the amplifier circuit 1043, amplifier 1050 corresponds to the first amplifier 551 in FIG. 5, with amplifier 1052 corresponding to the second amplifier 552, and resistors 1054, 1056, 1058 corresponding to resistors 554, 556, 558.

For the simulation, the amplifiers, 1050 and 1052, were selected according to LTC6269-10 of Linear Technology specifications, with the values for the remaining components identified below in table 1 with the values of components 1102 and 1103 selected to provide a resonant frequency around 10 MHz.

TABLE 1

| Component Reference | Value |
|---|---|
| 1102 | 21 uH |
| 1103 | 11.6 pF |
| 1104 | 0.4 Ω |
| 1105 | 0.01 Ω |
| 1101, 1106 | 1 uF |

TABLE 1-continued

| Component Reference | Value |
| --- | --- |
| 1066 | 10 kΩ |
| 1067 | 8 kΩ |
| 1056, 1054 | 20 kΩ |

The AC simulations results around the resonant frequency of 10 MHz are presented in FIG. 10. The plots labeled "V(n003)" show the AC amplitude and phase at the output node 1044 of the first amplifier 1050. The plots labeled "V(n011)" show the AC amplitude and phase at the output node 1045 of the second amplifier 1045.

As may clearly be seen from the plots, the output voltages at the two output nodes 1044, 1045 are of the same magnitude and opposite in phases demonstrating the effectiveness of the single-ended to differential converter presented herein. The bandwidth of the filter is about 20 kHz which corresponds to a quality factor Q=500.

The methods and circuits according to the present application have a number of advantages including:
the DC biasing circuit does not affect the load impedance of the bandpass filter;
a very high-quality factor (Q) may be obtained;
low noise as the full AC input voltage is amplified by the first amplifier in contrast to the prior art circuits and methods where half of the input signal is seen at the two amplifier's noninverting inputs.

It is however not intended to limit the present teaching to any one set of advantages or features as modifications can be made without departing from the spirit and or scope of the present teaching.

The circuits and methods of providing a single-ended to differential converter are described above with reference to certain embodiments. A skilled artisan will, however, appreciate that the principles and advantages of the embodiments can be implemented in other circuits.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

The invention claimed is:

1. A single-ended to differential converter for converting a single-ended input to dual outputs, the converter comprising:
a band pass filter having an input node for coupling to the single-ended input, an output node, and a reference node, wherein the band pass filter is arranged to band pass filter the single ended input and provide the band pass filtered input signal to the output node as an output signal,
an amplifier circuit accepting the output signal as an input and providing dual outputs, and
a DC biasing circuit directly coupled to the band pass filter and configured for generating a bias voltage and applying it to the reference node of the band pass filter, wherein the amplifier circuit comprises:
a first operational amplifier having a first inverting input and a first non-inverting input and providing a first output to a first output node, wherein the output node of the band pass filter is connected to the first non-inverting input and a first feedback path is provided between the first output node and the first inverting input;
a second operational amplifier having a second inverting input and a second non-inverting input and providing a second output to a second output node wherein the reference node of the band pass filter is connected to the second non-inverting input and a second feedback path is provided between the second output node and the second inverting input; and
a gain element connected between the first inverting input and the second inverting input, wherein a first feedback resistor is provided in the first feedback path and a second feedback resistor is provided in the second feedback path and the gain element comprises a gain resistor,
and wherein the sum of the resistances of the first feedback resistor and the gain resistor are approximately equal to the resistance of the second feedback resistor.

2. The single-ended to differential converter according to claim 1, wherein the band pass filter is a RC bandpass filter.

3. The single-ended to differential converter according to claim 1, wherein a first filter capacitor is connected between the input of the band pass filter and an intermediate filter node, a first filter resistor connected between the intermediate filter node and the reference node, a second filter resistor connected between the intermediate filter node and the output node and a second filter capacitor connected between the output node and the reference node and a third filter capacitor connected between the reference node and ground.

4. The single-ended to differential converter according to claim 1, wherein the band pass filter is a LC bandpass filter.

5. The single-ended to differential converter according to claim 4, wherein a first filter capacitor is connected between the input of the band pass filter and the output node and a first filter inductor is connected between the output node and the reference node, a second filter capacitor is connected between the output node and the reference node and a third filter capacitor connected between the reference node and ground.

6. The single-ended to differential converter according to claim 1, wherein the band pass filter comprises a notch filter.

7. The single-ended to differential converter according to claim 6, wherein the band pass filter comprises a first capacitor connected at a first end to the input node and at a second end to a second capacitor connected in series with a third capacitor to the output node, with a first resistor connected between the second end of the first capacitor and the reference node, a fourth capacitor connected between the reference node and ground, a second resistor connected between a common node of the second capacitor and third capacitor and ground, a third resistor and a fourth resistor connected in series between the second end of the first capacitor and the output node with the fifth capacitor connecting a common node between the third and fourth resistors and ground.

8. The single-ended to differential converter according to claim 1, wherein the DC biasing circuit comprises a first bias circuit resistor connected at a first end to a voltage source and at a second end to the reference node, a second bias circuit resistor connected between the reference node and ground.

9. The single-ended to differential converter according to claim 1, wherein the DC biasing circuit comprises a first transistor having a first source, first gate and first drain and a second transistor having a second source, second gate and second drain wherein the first source of the first transistor is connected to a reference voltage with the first gate, second gate and the first and second drains commonly connected to the reference node and the second source connected to ground.

10. A single-ended to differential converter for converting a single-ended input to dual outputs, the converter comprising:

a band pass filter having an input node for coupling to the single-ended input, an output node, and a reference node, wherein the band pass filter is arranged to band pass filter the single ended input and provide the band pass filtered input signal to the output node as an output signal, an amplifier circuit accepting the output signal as an input and providing dual outputs, a first operational amplifier having a first inverting input and a first non-inverting input and providing a first output to a first output node, wherein the output node of the band pass filter is connected to the first non-inverting input and a first feedback path is provided between the first output node and the first inverting input;

a second operational amplifier having a second inverting input and a second non-inverting input and providing a second output to a second output node wherein the reference node of the band pass filter is connected to the second non-inverting input and a second feedback path is provided between the second output node and the second inverting input;

a gain resistor connected between the first inverting input and the second inverting input, and

wherein the reference node of the band pass filter is directly biased by a DC voltage from a DC biasing circuit, wherein a first feedback resistor is provided in the first feedback path and a second feedback resistor is provided in the second feedback path and wherein the sum of the resistances of the first feedback resistor and the gain resistor are approximately equal to the resistance of the second feedback resistor.

11. The single-ended to differential converter according to claim 10, wherein the band pass filter comprises a first filter capacitor connected between the input of the band pass filter and an intermediate filter node, a first filter resistor connected between the intermediate filter node and the reference node, a second filter resistor connected between the intermediate filter node and the output node and a second filter capacitor connected between the output node and the reference node.

12. The single-ended to differential converter according to claim 10, wherein a first filter capacitor is connected between the input of the band pass filter and the output node and a first filter inductor is connected between the output node and the reference node, a second filter capacitor is connected between the output node and the reference node and a third filter capacitor connected between the reference node and ground.

13. The single-ended to differential converter according to claim 10, wherein the band pass filter comprises a first capacitor connected at a first end to the input node and at a second end to a second capacitor connected in series with a third capacitor to the output node, with a first resistor connected between the second end of the first capacitor and the reference node, a fourth capacitor connected between the reference node and ground, a second resistor connected between a common node of the second capacitor and third capacitor and ground, a third resistor and fourth resistor connected in series between the second end of the first capacitor and the output node with a fifth capacitor connecting a common node between the third and fourth resistors and ground.

14. The single-ended to differential converter according to claim 10, wherein the DC biasing circuit comprises a first bias circuit resistor connected at a first end to a voltage source and at a second end to the reference node, a second bias circuit resistor connected between the reference node and ground and a first bias circuit capacitor connected between the reference node and ground.

15. The single-ended to differential converter according to claim 10, wherein the DC biasing circuit comprises a first transistor having a first source, first gate and first drain and a second transistor having a second source, second gate and second drain wherein the first source is connected to a reference voltage with the first gate, second gate and the first and second drains commonly connected to the reference node and the second source connected to ground.

16. A single-ended to differential converter for converting a single-ended input to dual outputs, the converter comprising:

a filter having an input node for coupling to the single-ended input, an output node, and a reference node connected to a DC bias voltage, wherein the filter is arranged to filter the single ended input and provide the filtered input signal to the output node as an output signal;

a first operational amplifier having a first inverting input and a first non-inverting input and providing a first output to a first output node, wherein the output node of the filter is connected to the first non-inverting input and a first feedback path is provided between the first output node and the first inverting input;

a second operational amplifier having a second inverting input and a second non-inverting input and providing a second output to a second output node wherein the reference node of the band pass filter is connected to the second non-inverting input and a second feedback path is provided between the second output node and the second inverting input, wherein a first feedback resistor is provided in the first feedback path and a second feedback resistor is provided in the second feedback path and a gain element comprises a gain resistor and wherein the sum of the resistances of the first feedback resistor and the gain resistor are approximately equal to the resistance of the second feedback resistor; and the gain element is connected between the first inverting input and the second inverting input.

\* \* \* \* \*